US006938653B2

(12) United States Patent
Sakaida et al.

(10) Patent No.: US 6,938,653 B2
(45) Date of Patent: Sep. 6, 2005

(54) FILLING EQUIPMENT AND METHOD FOR FILLING FLUIDIZED MATERIAL

(75) Inventors: Atusi Sakaida, Nagoya (JP); Toshihisa Taniguchi, Handa (JP); Keikichi Takada, Takahama (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/849,011

(22) Filed: May 20, 2004

(65) Prior Publication Data

US 2005/0034780 A1 Feb. 17, 2005

(30) Foreign Application Priority Data

May 29, 2003 (JP) ....................................... 2003-153103

(51) Int. Cl.[7] .................................................. B65B 1/04
(52) U.S. Cl. ...................................................... 141/125
(58) Field of Search ............................ 141/125, 67, 65, 141/234, 4, 8, 250, 270, 284, 280

(56) References Cited

U.S. PATENT DOCUMENTS 4,932,443 A * 6/1990 Karolek et al. .............. 141/1.1
6,695,020 B2 * 2/2004 Sakaida et al. ............. 141/234

FOREIGN PATENT DOCUMENTS

JP A 2001-203437 7/2001

* cited by examiner

*Primary Examiner*—Steven O. Douglas
(74) *Attorney, Agent, or Firm*—Oliff & Berridge, PLC

(57) ABSTRACT

A method for filling a fluidized material into a hole having a bottom, the hole disposed on one surface of a sheet member, the method includes the steps of: depressurizing a first closed space, which is formed on the one surface of the sheet member; depressurizing a second closed space, which is adjacent to the first closed space and accumulates the fluidized material; displacing the hole together with the sheet member to the second closed space, the hole depressurized in the first closed space; applying the fluidized material on the surface of the sheet member; and filling the applied fluidized material into the hole.

22 Claims, 4 Drawing Sheets

FILLING EQUIPMENT AND METHOD FOR FILLING FLUIDIZED MATERIAL

CROSS REFERENCE TO RELATED APPLICATION

This application is based on Japanese Patent Application No. 2003-153103 filed on May 29, 2003, the disclosure of which is incorporated herein by reference.

FIELD OF THE INVENTION

The present invention relates to filling equipment and a method for filling a fluidized material. Specifically, the present invention relates to filling equipment and a method for filling a fluidized material in a hole disposed on a surface of a sheet member.

BACKGROUND OF THE INVENTION

A paste filling method and paste filling equipment are disclosed in Japanese Patent Application Publication No. 2001-203437. The paste filling equipment fills a paste as a fluidized material in a hole having a bottom as a blind via-hole (i.e., a half penetrate hole).

FIG. 4A shows the above paste filling equipment 100. In the paste filling equipment 100 shown in FIG. 4A, a substrate 101 having the blind via-hole 102 is disposed on the top of a base 201. The substrate 101 is vacuumed up through a suction opening 201*a* and a vacuum exhaust path 201*b* so that the substrate 101 is stuck and fixed on the base 201. A frame 202 is disposed on and contacts an outer periphery of the substrate 101 except for a paste-to-be-filled region of the substrate 101. On the top surface side of the substrate 101, a vacuum nozzle 205 is disposed on and contacts the substrate 101. Further, a paste 207 is accumulated in a space surrounded by the sidewall of the vacuum nozzle 205, the surface of the substrate 101, and the sidewall of a squeegee for squeezing the paste. After that, while air is vacuumed by the vacuum nozzle 205, the vacuum nozzle 205 and the squeegee 204 are simultaneously and relatively displaced in parallel to the surface of the substrate 101, so that the paste 207 is filled in the blind via-hole 102, which is depressurized.

FIGS. 4B and 4C are enlarged cross sectional views explaining the method for filling the paste 207 into the blind via-hole 102 by the paste filling equipment 100. The paste filling equipment 100 shown in FIG. 4A fills the paste 207 into the blind via-hole 102 while the blind via-hole 102 is evacuated by the vacuum nozzle 205. Therefore, the paste filling equipment 100 does not have a problem about remaining the air in the bottom of the blind via-hole 102, compared with a case where the paste 207 is filled in the blind via-hole 102 having atmospheric pressure. Here, in the blind via-hole 102 having atmospheric pressure, the air is remained because the air disposed in the bottom of the blind via-hole 102 is not exchanged to the paste 207.

On the other hand, the space surrounded by the sidewall of the vacuum nozzle 205, the surface of the substrate 101 and the sidewall of the squeegee 204 is in a state of atmospheric pressure, and the paste 207 is accumulated in the space. Therefore, the paste 207, which is under the atmospheric pressure, as shown in FIG. 4B, is delivered with involving the air disposed in the space in accordance with a movement of the squeegee 204. Accordingly, in the paste filling equipment 100 shown in FIG. 4A, a bubble 207*v* is produced in the paste 207. The paste 207 involving the bubble 207*v* is filled in the blind via-hole 102, as shown in FIG. 4C. After the bubble 207*v* is involved in the blind via-hole 102, the bubble 207*v* cannot be removed in a later process. Therefore, in the blind via-hole 102 having the paste 207 with the bubble 207*v*, the paste 207 is not filled sufficiently, so that it may cause a conductive fault.

SUMMARY OF THE INVENTION

In view of the above-described problem, it is an object of the present invention to provide filling equipment and a method for filling a fluidized material in a hole disposed on a surface of a sheet member without including a bubble.

A method for filling a fluidized material into a hole having a bottom, the hole disposed on one surface of a sheet member, the method includes the steps of: depressurizing the first closed space, which is formed on the first region disposed at a predetermined portion of the one surface of the sheet member, wherein the hole having the bottom is disposed on the one surface of the sheet member; depressurizing the second closed space, which is formed on the second region disposed at another predetermined portion of the one surface of the sheet member, wherein the second region is adjacent to the first region, wherein the second closed space accumulates the fluidized material, and wherein a degree of vacuum in the second closed space is lower than that in the first closed space; displacing the hole having the bottom together with the sheet member from the first closed space to the second closed space, wherein the hole having the bottom is depressurized in the first closed space in the step of depressurizing the first closed space; applying the fluidized material on the surface of the second region of the sheet member, the fluidized material accumulated in the second closed space; and filling the fluidized material into the hole having the bottom, the fluidized material applied on the surface of the sheet member.

The above method performs to evacuate air in the hole having the bottom in the depressurized first closed space before the fluidized material is filled in the hole having the bottom, which is disposed on the one surface of the sheet member. Further, the step of depressurizing the second closed space performs to depressurize the second closed space to have a degree of vacuum lower than that of the first closed space, the second closed space accumulating the fluidized material. Since the second closed space is formed to be adjacent to the first closed space, the hole having the bottom, the inside air of which is evacuated in the first closed space, can be displaced to the second closed space with the fluidized material accumulated therein.

Furthermore, in the step of applying the fluidized material, the fluidized material accumulated in the second closed space is applied on the second region of the one surface of the sheet member. In the step of applying the fluidized material, since the second closed space is depressurized, involving the air in the fluidized material is limited to the minimum so that a bubble is reduced. Here, the bubble is to be involved into the fluidized material, which is to be applied to the one surface. Thus, the fluidized material, in which the bubble is reduced, is applied to the surface of the sheet member. Then, the fluidized material is filled into the hole in the step of filling the fluidized material. Accordingly, no bubble is remained in the fluidized material, which is filled in the hole having the bottom disposed on the one surface of the sheet member.

Preferably, the one surface of the sheet member, on which the hole having the bottom is disposed, is directed vertically downward, and the first and second closed spaces are disposed vertically under the first and second regions, respectively. In this case, the second closed space is formed vertically under the sheet member. Therefore, the fluidized material accumulated in the second closed space is scooped up and applied on the surface of the sheet member. Thus, the fluidized material accumulated in the second closed space is not fluidized excessively such that the bubble is involved in the fluidized material.

Preferably, the second closed space includes a transfer roller. The step of applying the fluidized material includes the step of supplying the fluidized material on the surface of the sheet member in such a manner that the transfer roller is rotated so that the fluidized material is adhered to a roller surface of the transfer roller. Further, the step of applying the fluidized material includes the step of transferring and applying the fluidized material on the surface of the sheet member by the transfer roller.

In this case, the fluidized material accumulated in the second closed space is smoothly scooped up by the rotation of the transfer roller, so that the fluidized material is supplied to the one surface of the sheet member by adhering to the roller surface. Therefore, flow of the fluidized material accumulated in the second closed space is appropriately suppressed. Further, the fluidized material supplied to the one surface of the sheet member is smoothly transferred by the roller, so that the fluidized material is applied on the surface of the sheet member. At this time, involving the bubble is suppressed as much as possible. Thus, the fluidized material with the bubble being reduced is transferred to the surface of the sheet member. Then, the fluidized material is filled into the hole in the step of filling the fluidized material. Accordingly, no bubble is remained in the hole, which is filled with the fluidized material and disposed on the surface of the sheet member.

Preferably, the step of applying the fluidized material further includes the step of setting the thickness of the fluidized material into a predetermined thickness by the thickness control member, the fluidized material adhering to the roller surface of the transfer roller. The thickness control member faces the roller surface. In this case, the thickness control member thinly extends the fluidized material, which is to be supplied to the surface of the sheet member by adhering to the roller surface. Therefore, a fine bubble involved in the fluidized material can be removed according to expansion effect of the depressurized second closed space. Accordingly, the bubble in the fluidized material, which is to be transferred to the surface of the sheet member and just before filled, is much reduced.

The above method is more effective in a case where the fluidized material has a viscosity equal to or larger than 50 Pa·s. The fluidized material having high viscosity equal to or larger than 50 Pa·s easily involves the bubble. Once the bubble is involved in the fluidized material, the bubble is not easily removed. With using the method for filling the fluidized material according to the present invention, the bubble can be effectively removed from the above fluidized material having the high viscosity, i.e., from the fluidized material to be applied on the one surface of the sheet member. Therefore, no bubble is remained in the hole filled with the fluidized material.

Preferably, the step of displacing the hole together with the sheet member includes the step of displacing relatively the sheet member and the first and second closed spaces in the direction perpendicular to the rotation axis of the transfer roller. In this case, even when the sheet member having multiple holes therein is large, the fluidized material is easily and steadily filled in the holes only by displacing the sheet member and the first and second closed spaces relatively in the direction perpendicular to the rotation axis of the transfer roller.

Further, filling equipment for filling a fluidized material into a hole having a bottom, the hole disposed on one surface of a sheet member, the equipment includes: a vacuum chamber having high vacuum and contacting the one surface of the sheet member; a filling chamber contacting the one surface of the sheet member, disposed adjacent to the vacuum chamber and having low vacuum lower than that of the vacuum chamber; and a means for displacing the sheet member and the vacuum and filling chambers relatively in a horizontal direction parallel to the one surface of the sheet member. The filling chamber accumulates the fluidized material for filling the fluidized material into the hole having the bottom. The filling chamber further includes a transfer roller and a filling squeegee. The transfer roller is rotatable and capable of supplying a part of the fluidized material accumulated in the filling chamber to the one surface of the sheet member by adhering the part of the fluidized material on a roller surface of the transfer roller so that the part of the fluidized material is transferred to the one surface of the sheet member by the transfer roller. The filling squeegee is capable of squeezing and filling the part of the fluidized material transferred to the one surface of the sheet member into the hole having the bottom.

The above equipment performs to evacuate air in the hole having the bottom in the depressurized vacuum chamber before the fluidized material is filled in the hole having the bottom, which is disposed on the one surface of the sheet member. Further, the fluidized material is accumulated in the filling chamber, which is depressurized to have a degree of vacuum lower than that of the vacuum chamber. Since the filling chamber is formed to be adjacent to the vacuum chamber, the hole having the bottom, the inside air of which is evacuated in the vacuum chamber, can be displaced to the filling chamber with the fluidized material accumulated therein by using the means for displacing.

Furthermore, the fluidized material accumulated in the filling chamber is applied on the one surface of the sheet member. Here, since the filling chamber is depressurized, involving the air is limited to the minimum so that a bubble is reduced. The bubble is to be involved into the fluidized material, which is to be applied to the one surface. Thus, the fluidized material, in which the bubble is reduced, is applied to the surface of the sheet member. Then, the fluidized material is filled into the hole having the bottom by the filling squeegee. Accordingly, no bubble is remained in the fluidized material, which is filled in the hole having the bottom disposed on the one surface of the sheet member.

BRIEF DESCRIPTION OF THE DRAWINGS

The above and other objects, features and advantages of the present invention will become more apparent from the following detailed description made with reference to the accompanying drawings. In the drawings:

FIGS. 1B and 1C are partially enlarged perspective views showing the sheet member before and after the fluidized material is filled in;

DETAILED DESCRIPTION OF THE PREFERRED EMBODIMENT

Figure 1A:
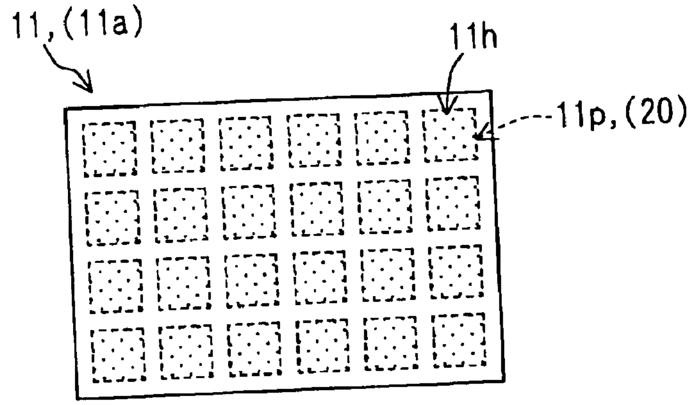
FIG. 1A is a top view showing a sheet member as a filling object of a fluidized material, according to a preferred embodiment of the present invention.
Figure 1B:
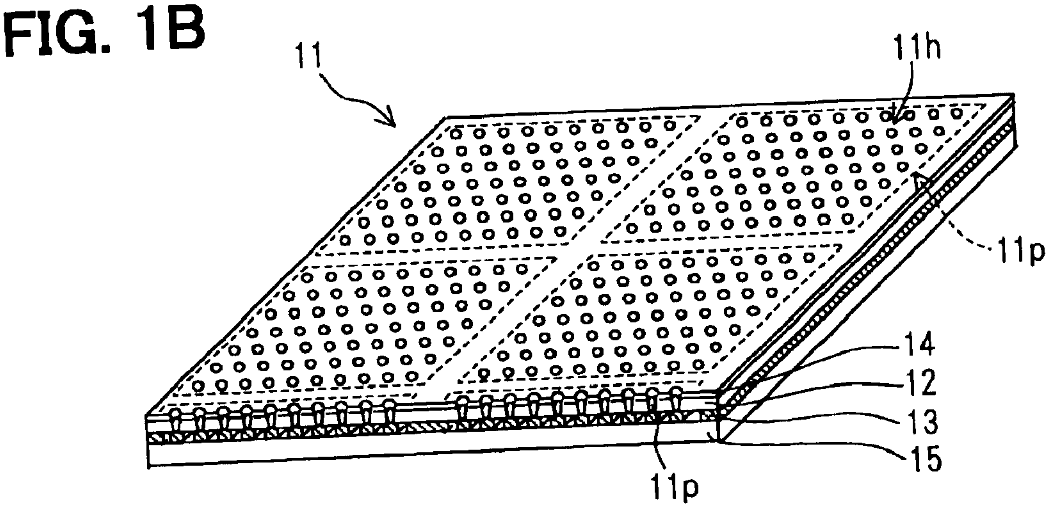
Figure 1C:
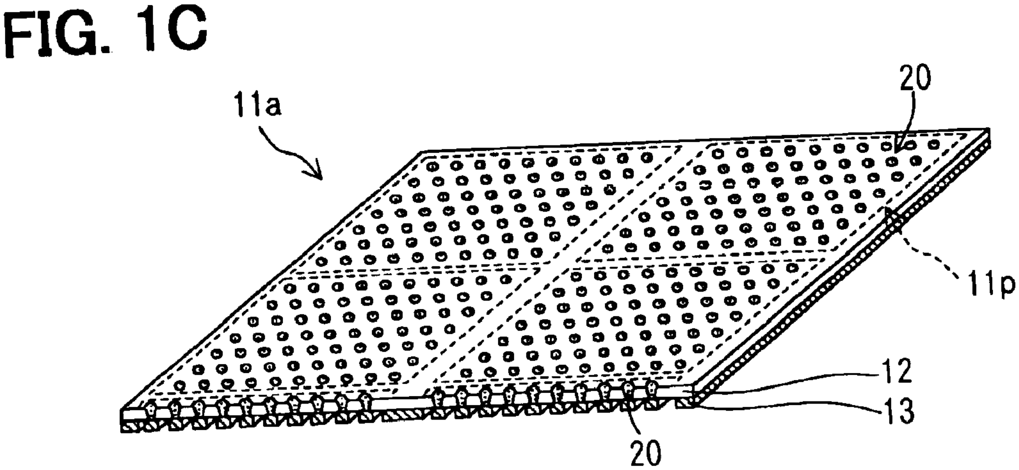

FIGS. 1A to 1C show a sheet member having a hole disposed on a surface thereof. The sheet member is a filling object of a fluidized material. FIG. 1A is a top view showing a sheet member 11, 11*a*. FIG. 1B is a partially enlarged perspective view showing a detailed construction of the sheet member 11 before the fluidized material is filled in. FIG. 1C is a partially enlarged perspective view showing the sheet member 11 after the fluidized material is filled in.

The sheet member 11, 11*a* shown in FIGS. 1A to 1C is suitably used for a manufacturing method for a multi-layered circuit board. The sheet member has a blind via-hole 11*h* as a hole having a bottom. A metallic paste 20 as a fluidized material is filled in the blind via-hole 11*h*.

In FIG. 1B, a reference No. 12 represents a resin sheet made of thermoplastic resin. Specifically, the resin sheet 12 is made of poly ether ether ketone resin having 65 to 35 wt. % and poly ether imide resin having 35 to 65 wt. %. The thickness of the resin sheet is in a range between 25 $\mu$m and 75 $\mu$m. A conductive pattern 13 is formed on one surface of the resin sheet 12. The conductive pattern 13 is prepared such that a conductive foil such as copper foil or an aluminum foil is attached to the one surface of the resin sheet 12, and then, the conductive foil is patterned.

A pair of protection films 14, 15 is attached to sandwich the resin sheet 12 and the conductive pattern 13. The protection films 14, 15 are made of poly ethylene terephthalate. The protection films 14, 15 protect the resin sheet 12 and the conductive pattern 13 from being damaged in a later described filling process of a metallic paste. Further, the protection films 14, 15 protect the resin sheet 12 and the conductive pattern 13 from being contaminated with the metallic paste 20. A sheet member 11 has a total thickness in a range between 150 $\mu$m and 250 $\mu$m, and has high flexibility.

On the surface of the sheet member 11, a fine hole (i.e., a blind via-hole as a hole having a bottom) 11*h* is disposed at a position, which is to be connected between layers in a multi-layered circuit board. The blind via-hole 11*h* has a diameter about 100 $\mu$m, penetrates the protection film 14 and the resin sheet 12, and has a bottom of the conductive pattern 13. The blind via-hole 11*h* is formed by irradiating a carbon dioxide gas laser beam from the upside in FIG. 1B.

The metallic paste 20 as a fluidized material is filled in the blind via-hole 11*h* of the sheet member 11 shown in FIG. 1B by using a later described method for filling the fluidized material and filling equipment. The metallic paste 20 is prepared such that a metallic powder made of silver and tin, a binder resin and an organic solvent are mixed and processed to a paste. In general, the metallic paste 20 has higher viscosity as the conductivity of the metallic paste 20 becomes higher. This is because metallic filler content in the paste 20 is increased.

The metallic paste 20 to be filled in the blind via-hole 11*h* of the sheet member 11 shown in FIG. 1B has a viscosity of 200 Pa·s, which is comparatively high viscosity, compared with an ordinary metallic paste having a viscosity of 20 Pa·s. The metallic paste 20 made of silver and tin necessitates pressurized sintering. Therefore, even if the metallic paste 20 involves an invisible bubble having dimensions of several tens micrometers, the bubble causes crucial shortage of filling the metallic paste when the metallic paste 20 is filled in the blind via-hole 11*h* having the diameter of 100 $\mu$m. Therefore, it is required to fill the paste 20 without any bubble.

FIG. 1C shows the sheet member 11*a* after the protection films 14, 15 are removed and the metallic paste 20 is filled in the blind via-hole 11*h*. The metallic paste 20 is filled in the blind via-hole 11*h* having the bottom of the conductive pattern 13, and then multiple sheet members 11*a* are laminated and bonded together by heating and pressurizing so that a multi-layer circuit board is manufactured.

Here, as shown in FIG. 1A, the large one sheet member 11 includes multiple circuit patterns 11*p*, each of which has the same conductive pattern (not shown) and the same blind via-hole 11*h* pattern. The circuit patterns 11*p* are repeatedly formed. After multiple sheet members 11*a* are laminated and bonded together as described above, the circuit patterns 11*p* are cut off so that multiple multi-layer circuit boards are provided.

Figure 2A:
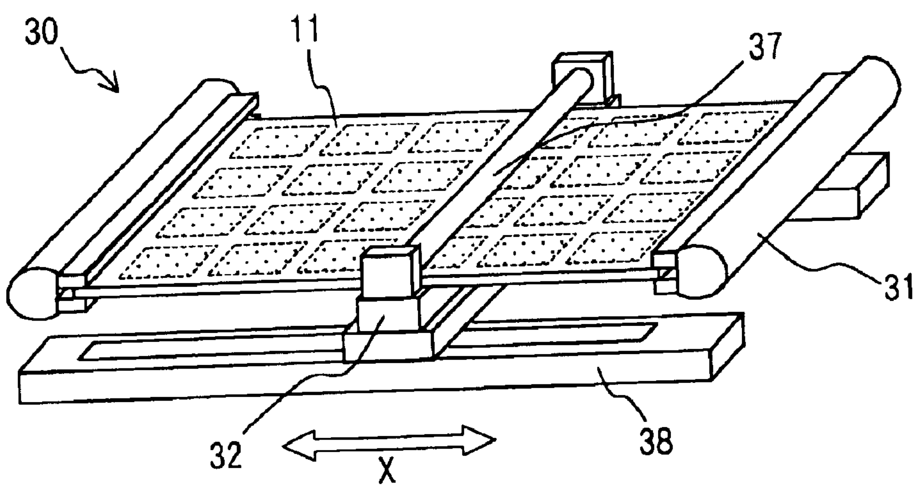
FIG. 2A is a perspective view showing whole filling equipment performing a method for filling the fluidized material according to the preferred embodiment.
Figure 2B:
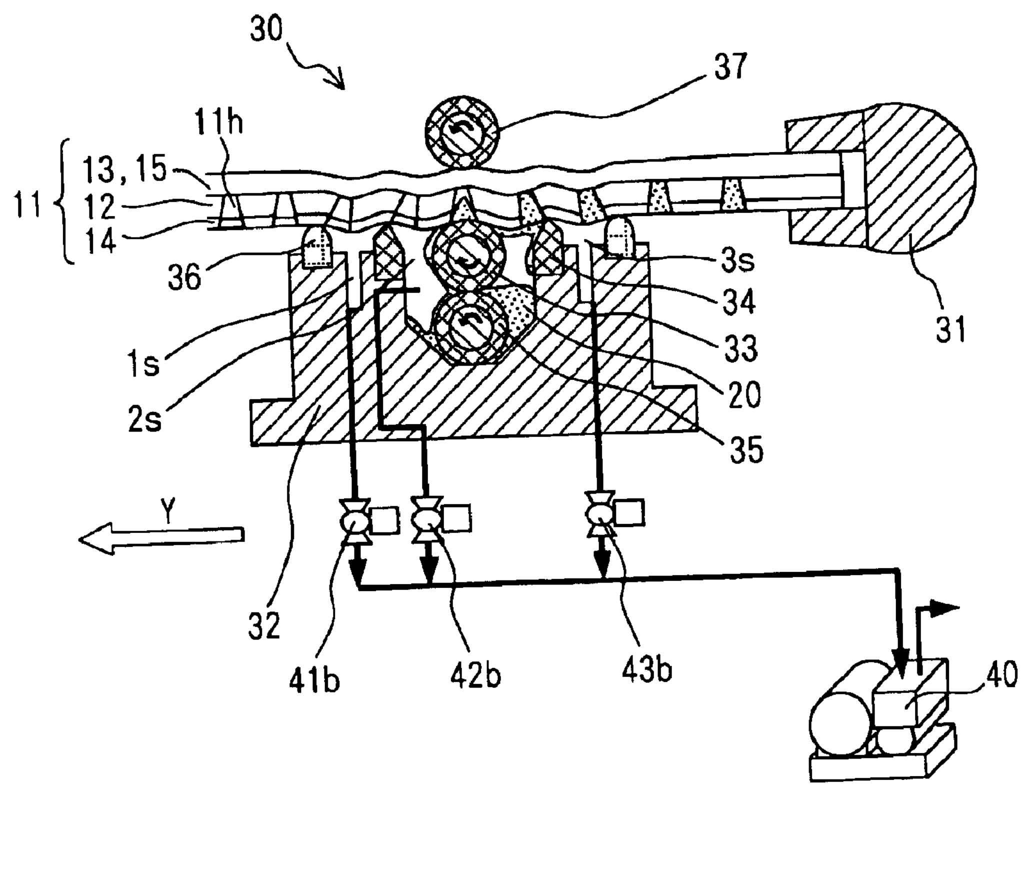
FIG. 2B is a schematic enlarged cross sectional view showing around a filling head.

FIGS. 2A and 2B show filling equipment 30 for performing a method of filling the fluidized material, according to the present embodiment of the present invention. FIG. 2A is a perspective view showing the whole filling equipment 30. FIG. 2B is a schematic enlarged cross sectional view showing around a filling head 32.

In the filling equipment 30 shown in FIGS. 2A and 2B, the sheet member 11 shown in FIG. 1B is inverted so as to direct the blind via-hole 11*h* vertically downwardly. Thus, the sheet member 11 is held with a movable clamp 31. Here, in FIG. 2B, to simplify the drawing, the conductive pattern 13 and the protection film 15 are described as one layer.

In FIGS. 2A and 2B, a reference No. 32 represents the filling head. The filling head 32 includes a vacuum chamber is and a filling chamber 2*s*. The vacuum chamber 1*s* and the filling chamber 2*s* contact the surface of the sheet member 11 from the vertical downside of the sheet member 11.

The vacuum chamber 1*s* provides the first closed space such that the filling head 32 contacts the surface of the sheet member 11. The vacuum chamber 1*s* is depressurized (i.e., evacuated) to have high vacuum by a vacuum pump 40 through a valve 41*b*. The filling chamber 2*s* is disposed adjacent to the vacuum chamber 1*s*. The filling head 32 contacts the surface of the sheet member 11 so that the second closed space is provided. The filling chamber 2*s* is depressurized to have low vacuum lower than that in the vacuum chamber 1*s* (i.e., the vacuum in the vacuum chamber 1*s* is higher than that in the filling chamber 2*s*). The metallic paste 20 as a fluidized material is accumulated (i.e., stored) in the vertical downside of the filling chamber 2*s*.

In the filling chamber 2*s*, a transfer roller 33 and a filling squeegee 34 are disposed for filling the metallic paste 20 into the blind via-hole 11*h* disposed on the surface of the sheet member 11. The transfer roller 33 rotates so that the transfer roller 33 supplies the metallic paste 20 to the surface of the sheet member 11 by adhering the metallic paste 20 to the roller surface of the transfer roller 33. Then, the metallic paste 20 is transferred and applied to the surface of the sheet member 11 by the transfer roller 33. The filling squeegee 34 provides to fill and squeeze the metallic paste 20 into the blind via-hole 11*h* steadily, the metallic paste being transferred to the surface of the sheet member 11 by the transfer roller 33. In the filling chamber 2*s*, a thickness control roller 35 is disposed. The thickness control roller 35 is in parallel to the transfer roller 33. The thickness control roller 35 faces the surface of the transfer roller 33 so that the thickness of the metallic paste 20 adhering to the roller surface of the transfer roller 33 is set to be a predetermined thickness. The thickness control roller 35 combined with the transfer roller 33 is used so that the metallic paste 20 is steadily scooped up, the metallic paste 20 accumulated in the vertical downside of the filling chamber 2*s*. Thus, the thickness control for the metallic paste 20, which is adhered to the roller surface of the transfer roller 33, is precisely controlled.

The filling head 32 shown in FIG. 2B includes the second vacuum chamber 3*s*, which is disposed adjacent to the filling chamber 2*s*. The second vacuum chamber 3*s* is symmetrically disposed opposite to the vacuum chamber 1*s*. The second vacuum chamber 3*s* provides the same function as the vacuum chamber 1*s* when the filling head 32 moves toward a direction opposite to a direction (i.e., a filling head moving direction) Y of an arrow shown in FIG. 2B so that the metallic paste 20 is filled in. When the metallic paste 20 is filled along with the filling head moving direction Y shown in FIG. 2B, the valve 43*b* is closed so that the second vacuum chamber 3*s* keeps to have atmospheric pressure. Here, in FIG. 2B, a reference No. 36 is a vacuum packing. The vacuum packing 36 is used together with the filling squeegee 34 so that the vacuum chamber is, the filling chamber 2*s* and the second vacuum chamber 3*s* keep each pressure. Thus, the pressure in each chamber 1*s*, 2*s*, 3*s* of the filling head 32 is switched by the valves 41*b*, 42*b*, 43*b* so that the filling equipment 30 shown in FIGS. 2A and 2B provides to fill the metallic paste 20 by a reciprocating operation.

As is obvious from the above description, the sheet member 11 is in a state such that the sheet member 11 is vacuumed up and held by the vacuum chamber is and the filling chamber 2*s* of the filling head 32 while filling the metallic paste 20.

In the filling equipment 30 shown in FIGS. 2A and 2B, a holding roller 37 is disposed in parallel to the transfer roller 33. The holding roller 37 contacts another surface opposite to the one surface of the sheet member 11, the one surface on which the vacuum chamber 1*s* and the filling chamber 2*s* contact. The holding roller 37 together with the transfer roller 33 sandwiches the sheet member 11 so that the sheet member 11 is held. The holding roller 37 provides to stabilize the transfer of the metallic paste 20 to the surface of the sheet member 11. Thus, the thickness of the metallic paste 20, which is transferred, can be controlled uniformly. Here, the sheet member 11 is held by a differential pressure between the pressure in each of the vacuum and filling chambers and the outside pressure. Therefore, the holding roller 37 can be omitted.

In the filling equipment 30 shown in FIG. 2A, the filling head 32 and the holding roller 37 integrally move on a rail 38 in a direction (i.e., a left and right direction X) perpendicular to a rotation axis of the transfer roller 33 and in a horizontal direction in parallel to the surface of the sheet member 11. However, the filling head 32 and the holding roller 37 are fixed, and the sheet member 11 can be displaced in the left and right direction X in FIG. 2A. In the filling equipment 30 shown in FIG. 2A, even when the sheet member 11 is large, the metallic paste 20 is filled in readily and steadily only by moving the filling head 32 relatively relative to the sheet member 11, the filling head 32 having the same width as the sheet member 11. Further, the width of the filling head 32 becomes small so as to mount the filling head 32 on a robot, which is movable on a plane, so that the robot with the filling head 32 can move on the surface of the sheet member 11 controllably. Thus, the metallic paste 20 can be partially filled in a part of the surface of the sheet member 11. Although the sheet member 11 is held with the clamp 31, as shown in FIG. 2A, the sheet member 11 can be exchanged to a roll sheet and the filling head 32 can be fixed so that the roll sheet, on which filling the paste 20 is already performed, is winded to the holding roller 37. In this case, the roll sheet having large length can be performed to fill continuously.

Figure 3:
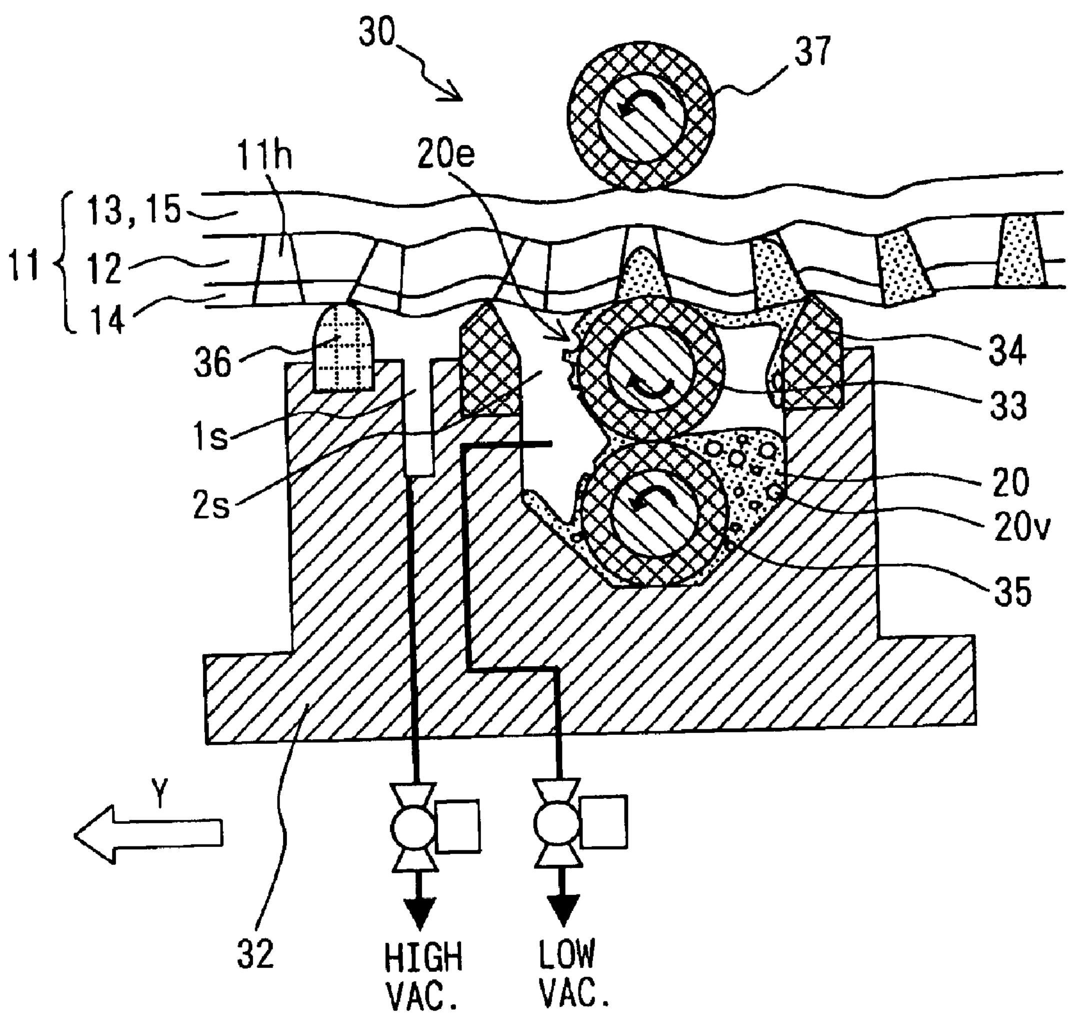
FIG. 3 is an enlarged cross sectional view explaining a manner of filling a metallic paste into the hole of the sheet member by using the filling equipment shown in FIGS. 2A and 2B.
Figure 4A:
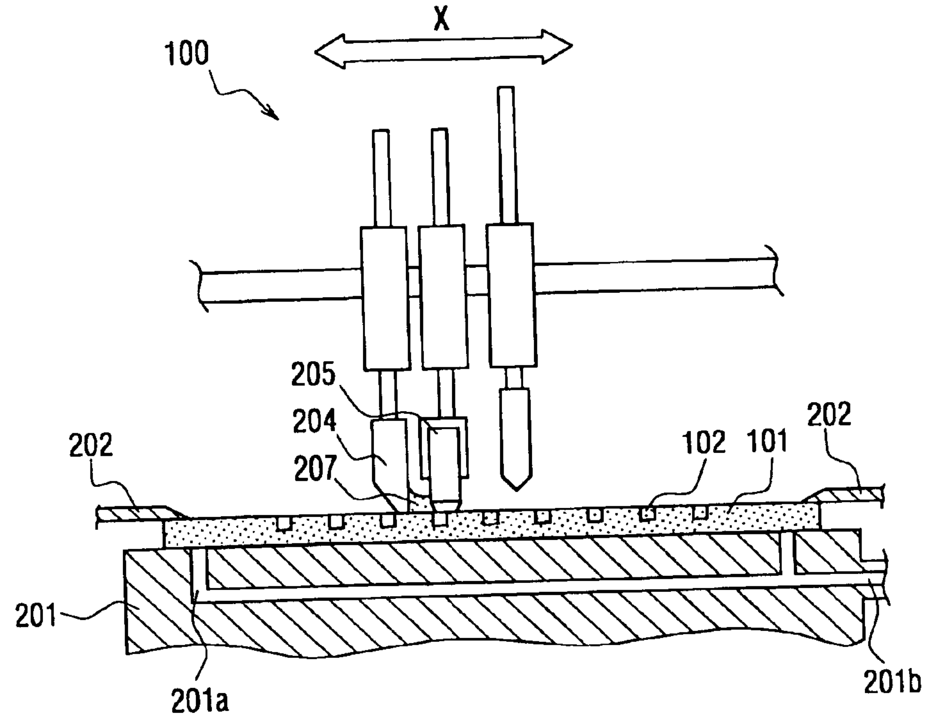
FIG. 4A is a cross sectional view showing paste filling equipment according to a prior art.
Figure 4B:
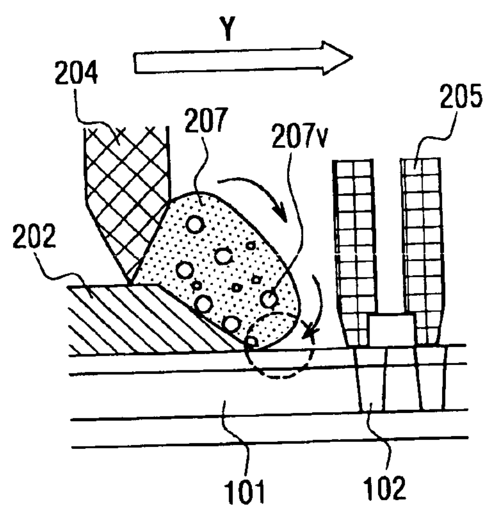
FIGS. 4B and 4C are enlarged cross sectional views explaining a manner of filling a paste into a blind via-hole by using the paste filling equipment shown in FIG. 4A.
Figure 4C:
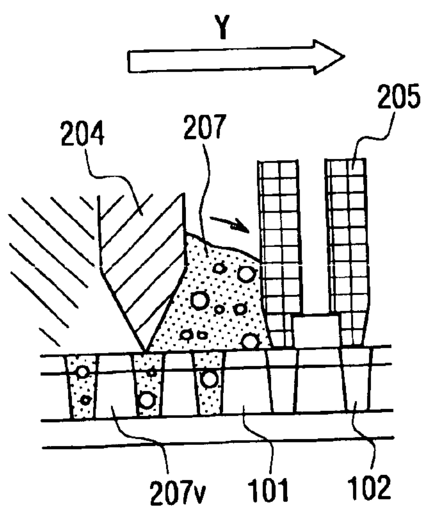

FIG. 3 is an enlarged cross sectional view explaining a state of filling the metallic paste 20 into the blind via-hole 11*h* of the sheet member 11. The method for filling the fluidized material according to the present embodiment is described as follows with using the enlarged cross sectional drawing of FIG. 3.

In the method for filling the fluidized material according to the present embodiment, at first, the defoamed metallic paste 20 is dropped and accumulated in the filling chamber 2*s* of the filling head 32. Then, the filling head 32 put and contact on the surface of the sheet member 11 from the vertical downside so that an opening portion of the filling head 32 is closed. Thus, the vacuum chamber 1*s* of the filling head 32 provides the first closed space having an upper cover of the surface of the sheet member 11. Therefore, the vacuum chamber 1*s* becomes the first closed space, and then, the vacuum chamber 1*s* is depressurized to have high vacuum (e.g., −0.1 MPa). Thus, the blind via-hole 11*h* disposed in the vacuum chamber 1*s* before filling the paste 20 therein is evacuated to the high vacuum.

The filling chamber 2*s* adjacent to the vacuum chamber 1*s* provides the second closed space having an upper cover of the surface of the sheet member 11. The filling chamber 2*s* becomes the second closed space, and then, the filling chamber 2*s* is depressurized to have low vacuum (e.g., −0.06 MPa), which is lower than that of the vacuum chamber 1*s*, in such a manner that the solvent of the metallic paste 20 accumulated in the filling chamber 2*s* does not evaporate and change the viscosity of the metallic paste 20.

Next, the filling head 32 is displaced to the filling head moving direction Y shown in FIG. 3, so that the blind via-hole 11*h* is displaced to the neighboring filling chamber 2*s* with holding the vacuum state of the blind via-hole 11*h*, the inside of which is depressurized in the vacuum chamber 1*s*.

When the filling head 32 is displaced, the transfer roller 33 disposed in the filling chamber 2*s* rotates by friction force between the sheet member 11 and the transfer roller 33. Further, the thickness control roller 35 disposed to face the surface of the transfer roller 33 also rotates by friction force between the thickness control roller 35 and the transfer roller 33 through the metallic paste 20. The metallic paste 20 accumulated in the vertical downside of the filling chamber 2*s* adheres to the roller surface of the thickness control roller 35, which is disposed under the transfer roller 33 so that the metallic paste 20 is scooped up by the thickness control roller 35 steadily. The scooped-up metallic paste 20 passes between the transfer roller 33 and the thickness control roller 35 so that the thickness of the metallic paste 20 is set to be a predetermined thickness precisely. The metallic paste 20, thickness of which is controlled, is supplied to the surface of the sheet member 11 with adhering to the roller surface of the transfer roller 33. Then, the metallic paste 20 is smoothly and continuously applied to the surface of the sheet member 11 by the transfer roller 33. At this time of applying the metallic paste 20, the sheet member 11 is sandwiched between the transfer roller 33 and the holding roller 37, so that the metallic paste 20 is transferred to the surface of the sheet member 11 with the uniform thickness. Here, the thickness of the metallic paste 20 adhering to the roller surface of the transfer roller 33 can be controlled by changing a distance between a squeegee disposed to face the roller surface of the transfer roller 33 and the roller surface.

In the above transfer process of the metallic paste 20, the metallic paste 20 accumulated in the vertical downside of the filling chamber 2*s* is scooped up smoothly by rotation of the thickness control roller 35 and the transfer roller 33 so that the metallic paste 20 is supplied to the surface of the sheet member 11. Thus, the metallic paste 20 accumulated in the vertical downside of the filling chamber 2*s* is not fluidized excessively. Further, since the filling chamber 2*s* is depressurized to the minimum necessary, the air is limited from involving into the metallic paste 20 to the minimum. Accordingly, the amount of the bubble 20*v* involving into the metallic paste 20 is also suppressed to the minimum. Further, the metallic paste 20 adhering to the roller surface of the transfer roller 33 is expanded thinly by the thickness control roller 35. The thinly expanded metallic paste 20 is defoamed, as shown in FIG. 3. This is because the filling chamber 2*s* is depressurized so that the fine bubble 20*v* remained in the metallic paste 20 is expanded and defoamed 20*e*. Thus, in the metallic paste 20 before transferring and filling to the surface of the sheet member 11, the content of the bubble 20*v* is limited to the minimum.

Next, the filling head 32 is displaced, so that the metallic paste 20 transferred to the surface of the sheet member 11 is squeezed and filled in the blind via-hole 11*h* by using the filling squeegee 34 disposed in the filling chamber 2*s*. The filling squeegee 34 is mounted to have an appropriate angle against the surface of the sheet member 11. Thus, the metallic paste 20 is filled in the blind via-hole 11*h*. Further, excess metallic paste 20 disposed on the surface of the sheet member 11 is scraped and removed. The scraped and removed metallic paste 20 returns the bottom of the filling chamber 2*s*. Thus, the metallic paste 20 is recycled and reused.

In the above filling process, the metallic paste 20, in which the content of the above described bubble 20*v* is suppressed to the minimum, is squeezed and filled in the depressurized blind via-hole 11*h*. Accordingly, the bubble 20*v* is not remained in the metallic paste 20 filled in the blind via-hole 11*h*.

As described above, the metallic paste 20 has the viscosity of 200 Pa·s, which is comparatively high viscosity, compared with the ordinary metallic paste having the viscosity of 20 Pa·s. The above method for filling the metallic paste 20 is more effective in a case where the metallic paste 20 has a viscosity equal to or larger than 50 Pa·s. The metallic paste 20 having high viscosity equal to or larger than or larger than 50 Pa·s easily involves the bubble 20*v*. Once the bubble 20*v* is involved in the metallic paste 20, the bubble 20*v* is not easily removed. With using the above method for filling the metallic paste 20, the bubble 20*v* can be effectively removed from the metallic paste 20 to be transferred on the sheet member 11. Therefore, no bubble 20*v* is remained in the blind via-hole 11*h* filled with the metallic paste 20. Accordingly, by using the metallic paste 20 filled in the blind via-hole 11*h* without any bubble 20*v*, a connecting conductor having high conductivity and high reliability is provided.

Thus, the filling equipment and the method for filling the fluidized material according to the above described present embodiment performs to fill the fluidized material into the blind via-hole 11*h* disposed on the surface of the sheet member 11 without remaining any bubble.

Although the one surface of the sheet member 11 including the blind via-hole 11*h* is disposed to direct vertically downward, and the filling head 32 is disposed under the sheet member 11, the one surface including the blind via-hole 11*h* can be disposed to direct vertically upward, and the filling head 32 can be disposed over the sheet member 11. In this case, it is considered that the shape of the filling head 32 is partially changed to accumulate the metallic paste 20 in the filling chamber 2*s*.

Such changes and modifications are to be understood as being within the scope of the present invention as defined by the appended claims.

What is claimed is:

1. A method for filling a fluidized material into a hole having a bottom, the hole disposed on one surface of a sheet member, the method comprising the steps of:

depressurizing a first closed space, which is formed on a first region disposed at a predetermined portion of the one surface of the sheet member, wherein the hole having the bottom is disposed on the one surface of the sheet member;

depressurizing a second closed space, which is formed on a second region disposed at another predetermined portion of the one surface of the sheet member, wherein the second region is adjacent to the first region, wherein the second closed space accumulates the fluidized material, and wherein a degree of vacuum in the second closed space is lower than that in the first closed space;

displacing the hole having the bottom together with the sheet member from the first closed space to the second closed space, wherein the hole having the bottom is depressurized in the first closed space in the step of depressurizing the first closed space;

applying the fluidized material on the surface of the second region of the sheet member, the fluidized material accumulated in the second closed space; and filling the fluidized material into the hole having the bottom, the fluidized material applied on the surface of the sheet member, wherein the one surface of the sheet member, on which the hole having the bottom is disposed, is directed vertically downward, and wherein the first and second closed spaces are disposed vertically under the first and second regions, respectively.

2. The method according to claim 1, wherein the fluidized material is accumulated in a vertical downside of the second closed space.

3. The method according to claim 1, wherein the second closed space includes a transfer roller, wherein the step of applying the fluidized material includes a step of supplying the fluidized material on the surface of the sheet member in such a manner that the transfer roller is rotated so that the fluidized material is adhered to a roller surface of the transfer roller, and wherein the step of applying the fluidized material further includes a step of transferring the fluidized material on the surface of the sheet member by the transfer roller.

4. The method according to claim 3, wherein the step of depressurizing the second closed space includes a step of defoaming a bubble penetrated into the fluidized material while the fluidized material is adhered to the roller surface of the transfer roller for supplying the fluidized material on the surface of the sheet member in the step of applying the fluidized material.

5. The method according to claim 3, wherein the step of applying the fluidized material further includes a step of setting a thickness of the fluidized material into a predetermined thickness by a thickness control member, the fluidized material adhering to the roller surface of the transfer roller, and wherein the thickness control member faces the roller surface of the transfer roller.

6. The method according to claim 5, wherein while the thickness of the fluidized material is set into a predetermined thickness in the step of applying the fluidized material, the fluidized material adhering to the roller surface of the transfer roller, the second closed space is depressurized in the step of depressurizing the second closed space so that a bubble does not penetrate into the fluidized material.

7. The method according to claim 5, wherein the thickness control member is a thickness control roller, which is disposed in parallel to the transfer roller.

8. The method according to claim 1, wherein the second closed space includes a filling squeegee, and wherein the step of filling the fluidized material further includes a step of squeezing and filling the fluidized material applied on the surface of the sheet member into the hole having the bottom by the filling squeegee.

9. The method according to claim 1, wherein the fluidized material has a viscosity equal to or larger than 50 Pa·s.

10. The method according to claim 9, wherein the fluidized material is a metal paste.

11. The method according to claim 3, wherein the step of displacing the hole having the bottom together with the sheet member includes a step of displacing relatively the sheet member and the first and second closed spaces in a direction perpendicular to a rotation axis of the transfer roller.

12. The method according to claim 3, further comprising the step of:

holding the sheet member by sandwiching the sheet member together with the transfer roller from another surface of the sheet member opposite to the one surface of the sheet member, the one surface on which the first and second closed spaces contact.

13. The method according to claim 12, wherein the step of holding the sheet member includes a step of holding the sheet member by a holding roller, which is disposed in parallel to the transfer roller.

14. Filling equipment for filling a fluidized material into a hole having a bottom, the hole disposed on one surface of a sheet member, the equipment comprising:

a vacuum chamber having high vacuum and contacting the one surface of the sheet member;

a filling chamber contacting the one surface of the sheet member, disposed adjacent to the vacuum chamber and having low vacuum lower than that of the vacuum chamber; and a means for displacing the sheet member and the vacuum and filling chambers relatively in a horizontal direction parallel to the one surface of the sheet member, wherein the filling chamber accumulates the fluidized material for filling the fluidized material into the hole having the bottom, wherein the filling chamber further includes a transfer roller and a filling squeegee, wherein the transfer roller is rotatable and capable of supplying a part of the fluidized material accumulated in the filling chamber to the one surface of the sheet member by adhering the part of the fluidized material on a roller surface of the transfer roller so that the part of the fluidized material is transferred to the one surface of the sheet member by the transfer roller, and wherein the filling squeegee is capable of squeezing and filling the part of the fluidized material transferred to the one surface of the sheet member into the hole having the bottom.

15. The filling equipment according to claim 14, wherein the one surface of the sheet member, on which the hole having the bottom is disposed, is directed vertically downward, and wherein the vacuum chamber and the filling chamber are disposed vertically under the sheet member, respectively.

16. The filling equipment according to claim 14, wherein the fluidized material is accumulated in a vertical downside of the filling chamber.

17. The filling equipment according to claim 14, wherein the filling chamber further includes a thickness control member for setting a thickness of the part of the fluidized material into a predetermined thickness, the part of the fluidized material adhering to the roller surface of the transfer roller, and wherein the thickness control member faces the roller surface of the transfer roller.

18. The filling equipment according to claim 17, wherein the thickness control member is a thickness control roller, which is disposed in parallel to the transfer roller.

19. The filling equipment according to claim 14, further comprising:

a second vacuum chamber, wherein the second vacuum chamber is disposed adjacent to the filling chamber and disposed opposite to the vacuum chamber, and wherein the second vacuum chamber contacts the one surface of the sheet member.

20. The filling equipment according to claim 14, wherein the means for displacing the sheet member is capable of displacing the sheet member and the vacuum and filling chambers relatively in a direction perpendicular to a rotation axis of the transfer roller.

21. The filling equipment according to claim 14, further comprising:

a holding member, wherein the holding member contacts an opposite surface of the sheet member opposite to the one surface of the sheet member so that the holding member holds the sheet member by sandwiching the sheet member together with the transfer roller, the one surface of the sheet member on which the vacuum and filling chambers contact, respectively.

22. The filling equipment according to claim 21, wherein the holding member is a holding roller, which is disposed in parallel to the transfer roller.

* * * * *